(12) United States Patent
Artman et al.

(10) Patent No.: US 8,195,970 B2
(45) Date of Patent: Jun. 5, 2012

(54) SYSTEM AND METHOD FOR ADAPTING A POWER USAGE OF A SERVER DURING A DATA CENTER COOLING FAILURE

(75) Inventors: Paul T. Artman, Austin, TX (US); David Moss, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 13/154,059

(22) Filed: Jun. 6, 2011

(65) Prior Publication Data

US 2011/0239025 A1    Sep. 29, 2011

Related U.S. Application Data

(62) Division of application No. 12/255,250, filed on Oct. 21, 2008, now Pat. No. 7,975,156.

(51) Int. Cl.
*G06F 1/32* (2006.01)

(52) U.S. Cl. ........ 713/323; 713/320; 713/322; 713/324; 713/330

(58) Field of Classification Search .................... 713/300
See application file for complete search history.

(56) References Cited

U.S. PATENT DOCUMENTS

| | | | |
|---|---|---|---|
| 6,535,798 B1 | 3/2003 | Bhatia et al. | |
| 6,848,054 B1 | 1/2005 | Watts, Jr. | |
| 7,051,221 B2 | 5/2006 | Clabes et al. | |
| 7,237,130 B2 | 6/2007 | Lee | |
| 7,451,332 B2 * | 11/2008 | Culbert et al. | 713/320 |
| 7,612,508 B2 | 11/2009 | Jreij et al. | |
| 7,809,869 B2 | 10/2010 | Atherton et al. | |
| 7,822,996 B2 | 10/2010 | Watts, Jr. | |
| 2002/0087904 A1 | 7/2002 | Cai | |
| 2003/0084088 A1 | 5/2003 | Shaffer | |
| 2004/0148528 A1 * | 7/2004 | Silvester | 713/300 |
| 2004/0264125 A1 | 12/2004 | Cheng et al. | |
| 2005/0030171 A1 | 2/2005 | Liu et al. | |
| 2005/0049729 A1 * | 3/2005 | Culbert et al. | 700/50 |
| 2005/0216221 A1 | 9/2005 | Broyles, III et al. | |
| 2005/0217300 A1 | 10/2005 | Cheng et al. | |
| 2006/0137377 A1 | 6/2006 | Samson et al. | |
| 2006/0253633 A1 | 11/2006 | Brundridge et al. | |
| 2007/0094436 A1 | 4/2007 | Keown, Jr. et al. | |
| 2007/0191993 A1 | 8/2007 | Wyatt | |
| 2007/0250219 A1 | 10/2007 | Gaskins et al. | |
| 2010/0191993 A1 | 7/2010 | Chaudhry et al. | |
| 2010/0324750 A1 | 12/2010 | Gaskins et al. | |
| 2011/0022866 A1 | 1/2011 | Cai | |

OTHER PUBLICATIONS

"Thermal Management System Monitoring"; Fujitsu Siemens Computers; Sep. 2002; pp. 1-5.*

* cited by examiner

*Primary Examiner* — Ryan Stiglic

(74) *Attorney, Agent, or Firm* — Larson Newman, LLP

(57) ABSTRACT

A device comprising a temperature measurement module, a performance state module, and a fan speed module. The temperature measurement module is configured to determine a temperature in a server, and to output a first control signal when temperature in the server is above a threshold. The performance state module is configured to change a performance state of the device to a lowest system performance state in response to the first control signal, and further configured to reduce a processor power consumption and a subsystem power consumption to a minimum power level in response to reducing the performance state to the lowest system performance state. The fan speed module is configured to reduce a fan speed to a minimum fan speed level based on the first control signal.

19 Claims, 5 Drawing Sheets

SYSTEM AND METHOD FOR ADAPTING A POWER USAGE OF A SERVER DURING A DATA CENTER COOLING FAILURE

CROSS-REFERENCE TO RELATED APPLICATIONS

This application is a divisional of U.S. patent application Ser. No. 12/255,250 entitled "System and Method for Adapting a Power Usage of a Server During a Data Center Cooling," filed on Oct. 21, 2008, the disclosure of which is hereby expressly incorporated by reference in its entirety.

FIELD OF THE DISCLOSURE

This disclosure generally relates to information systems, and more particularly relates to a system and method of adapting power usage of a server during a data center cooling failure.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

A data center can include a plurality of server racks, with each server rack containing at least one server. Servers are typically designed to turn off when a temperature of the server gets to a certain level so that damage is not caused in the server. Thus, the data center is usually kept within a specific temperature range, so that the servers do not overheat and shut down. If a facility cooling failure occurs, the fan speed of the servers typically increases in an attempt to cool the servers. The corresponding increase in power consumption can produce more heat in the servers and in the data center.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
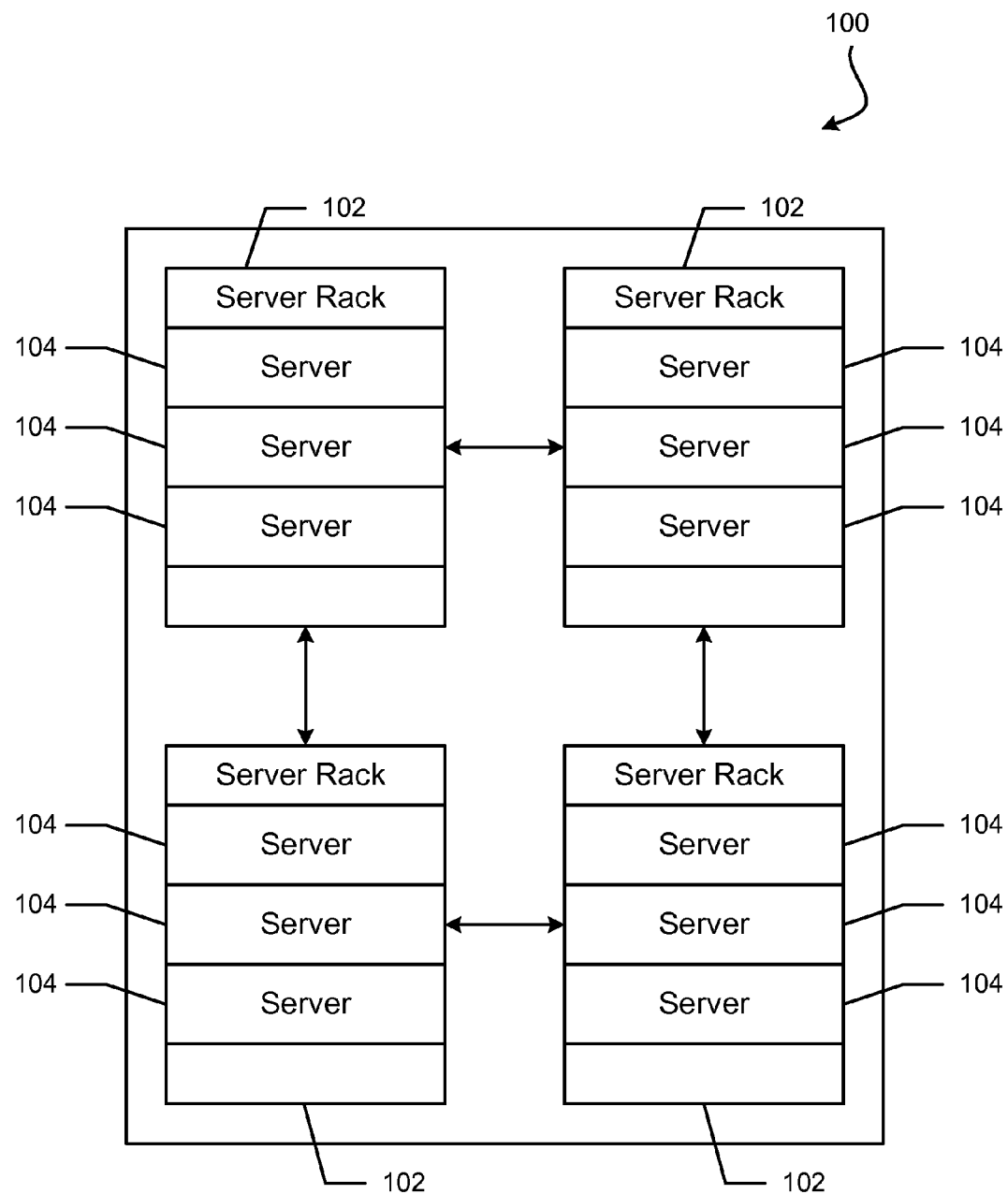
FIG. 1 is a block diagram of a data center.

FIG. 1 shows a data center 100 containing a plurality of information handling systems. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The data center 100 includes a plurality of server racks 102 having a plurality of servers 104. The server racks 102 are in communication with each other within the data center 100. The servers 104 are in communication with each other through the server racks 102. The data center 100 can have a central chiller or air conditioning unit (not shown) that maintains the data center within a specific temperature range. Additionally, the server racks 102 and the servers 104 can have cooling fans to cool individual components within the server racks and/or servers.

The temperatures in the data center 100, in the individual server racks 102, and in the individual servers 104 are preferably monitored to ensure that the temperatures are not above threshold levels. The threshold levels can be stored in the individual servers 104, and can be set at levels below shutdown temperatures for the servers. The shutdown temperature can be a specific temperature at which the servers 104 shut down so that the components in the servers are not damaged as a result of overheating. A rate of temperature change can also be monitored for the servers 104, for the server racks 102, and/or for the data center 100. If the rate of temperature change is above a threshold rate and/or the temperature is above the threshold temperature level, a determination can be made that a cooling failure is about to occur or has already occurred in the data center 100.

Figure 2:
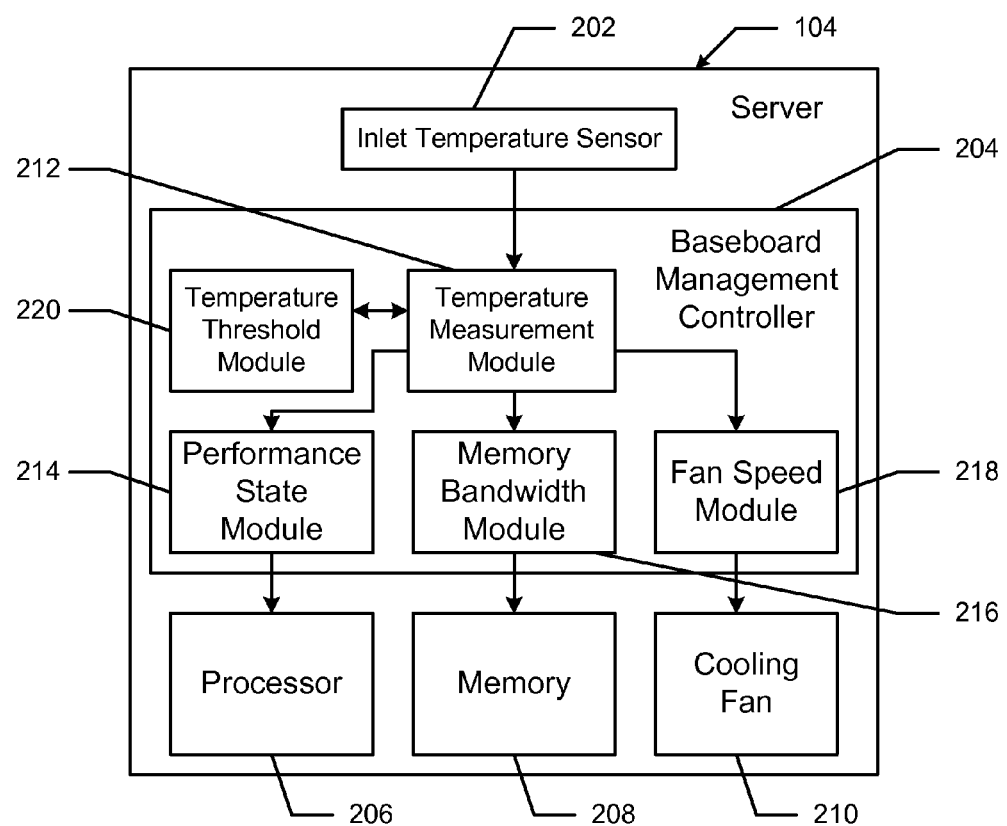
FIG. 2 is a block diagram of a server of the data center of FIG. 1.

FIG. 2 shows a block diagram of a server 104 within the data center 100 of FIG. 1. The server 104 includes an inlet temperature sensor 202, a baseboard management controller (BMC) 204, a processor 206, a memory 208, and a cooling fan 210. The BMC is in communication with the inlet temperature sensor 202, with the processor 206, with the memory 208, and with the cooling fan 210. The BMC 204 includes a temperature measurement module 212, a performance state module 214, a memory bandwidth module 216, a fan speed module 218, and a temperature threshold module 220. The temperature measurement module 212 is in communication with the performance state module 214, with the memory bandwidth module 216, with the fan speed module 218, and with the temperature threshold module 220. The performance state module 214 is in communication with the processor 206. The memory bandwidth module 216 is in communication with the memory 208. The fan speed module 218 is in communication with the cooling fan 210.

During operation, the inlet temperature sensor 202 measures a temperature that the BMC 204 can define to represent the ambient temperature at the server 104, in the server rack 102, and/or in the entire data center 100. The temperature measurement module 212 can retrieve the current temperature at specific intervals from inlet temperature sensor 202. Upon retrieving the current temperature, the temperature measurement module 212 can compare the current temperature to the threshold temperature level stored in the temperature threshold module 220. If the temperature measurement module 212 determines that the current temperature is higher than the threshold temperature level, the temperature measurement module can send a reduction control signal indicating a cooling failure to the performance state module 214, the memory bandwidth module 216, and the fan speed module 218.

The temperature measurement module 212 can also determine the rate of temperature change, such as based on a difference between the current temperature and a last temperature retrieved from the inlet temperature sensor 202, divided by a specific length of time between the two temperatures. The temperature measurement module 212 can then compare the rate of temperature change to a threshold rate stored in the temperature threshold module 220. If the temperature measurement module 212 determines that the rate of temperature change is higher than the threshold rate, the temperature measurement module can send the control signal to the performance state module 214, the memory bandwidth module 216, and the fan speed module 218.

Upon the performance state module 214 receiving the control signal from the temperature measurement module 212, the performance state module 214 can change the server 104 to a lowest system performance state by throttling the processor 206. Throttling the processor 206 can lower the system performance state by decreasing an amount of heat produced by the processor. The performance state module 214 can throttle the processor 206 by decreasing a duty cycle/frequency of an internal clock in the processor, or by decreasing a bus voltage of the processor. Based on a lower duty cycle/frequency of the internal clock, the processor 206 can operate at a lower speed, and can have lower power consumption.

In an embodiment, the performance state module 214 can gradually decrease the system performance state in response to an amount that the rate of temperature change is above the threshold rate, and/or an amount that the measured temperature is above the threshold temperature level. For example, as the measured temperature reaches the threshold temperature level, the performance state module 214 can decrease the system performance state by a specific amount. Then as the measured temperature continues to increase above the threshold temperature level, the performance state module 214 can gradually decrease the system performance state until the lowest system performance state is reached.

The power consumption of the server 104 can also be decreased by the memory bandwidth module 216 reducing the memory bandwidth for the memory 208. The memory bandwidth can be the rate at which data can be transferred to and from the memory 208. Thus, as the memory bandwidth is reduced, the data transfer rate is decreased, and the power consumption of the server 104 is reduced because the server does not need to operate as fast to store and transfer data to and from the memory 208 as compared to when the memory bandwidth is not reduced. In an embodiment, the memory bandwidth module 216 can gradually decrease the memory bandwidth in response to the amount that the rate of temperature change is above the threshold rate, and/or the amount that the measured temperature is above the threshold temperature level. For example, as the measured temperature reaches the temperature threshold level, the memory bandwidth module 216 can decrease the memory bandwidth by a specific amount. Then, as the measured temperature continues to increase above the threshold temperature level, the memory bandwidth module 216 can gradually decrease the system performance state until the lowest memory bandwidth is reached.

In response to receiving the control signal, the fan speed module 218 can reduce a fan speed of the cooling fan 210 to a minimum level. Additionally, based on the power consumption of the processor 206 and the memory 208 being at a minimum power level, the heat produced by the processor and the memory is reduce, thus, the cooling fan 210 can operate at the minimum fan speed without increasing the rate of temperature change and/or the temperature. Running the fans at the minimum level can also reduce the power consumption of the server 104. In an embodiment, the cooling fan module 218 can gradually decrease the fan speed of the cooling fan 210 in response to an amount that the rate of temperature change is above the threshold rate, and/or an amount that the measured temperature is above the threshold temperature level. For example, as the measured temperature reaches the temperature threshold level, the cooling fan module 218 can decrease the can speed by a specific amount. Then, as the measured temperature continues to increase above the threshold temperature level, the cooling fan module 218 can gradually decrease the fan speed until the lowest fan speed is reached.

With a reduction of the power consumption in the main components of the server 104 such as the processor 206, the memory 208, and the cooling fan 210, the heat produced by the server can be reduced so that the temperature does not continue to increase. Thus, by reducing the power consumption and associated heat produced by the server 104, a greater amount of time can elapse before the temperature in the server reaches the threshold temperature level thereby extending the operation of the server. The extra uptime can enable the server 104 to continue to operate throughout the cooling failure because the cooling units for the data center 100 may be able to cool down the temperature in the server before the threshold temperature level is reached. Alternatively, the extra time can also allow a user to switch the operations performed by the server 104 to another server before the server shuts down. It should also be understood that the threshold temperature level and/or the threshold rate can be exceeded in all of the servers 104 of the data center 100 at substantially the same time. Thus, each server 104 can perform the functions described above to prevent the entire data center 100 from shutting down during a cooling failure.

Upon the temperature measurement module 212 determining that the rate of temperature change is below the threshold rate, and/or the temperature is below the threshold temperature level, the temperature measurement module can send a resume control signal to the performance state module 214, the memory bandwidth module 216, and the fan speed module 218. Based on receiving the resume control signal, the performance state module 214 can increase the system performance state to a level prior to the cooling failure being detecting. Alternatively, the temperature measurement module 212 can cause the performance state module 214 to gradually increase the system performance state to the prior level as the rate of temperature change and/or the temperature decrease to and below the threshold rate and/or threshold temperature level. The performance state module 214 can increase the system performance state by increasing the duty cycle/frequency of the internal clock of the processor 206.

Based on receiving the resume control signal, the memory bandwidth module 216 can increase the memory bandwidth of the memory 208 to a level prior to the cooling failure. Alternatively, the temperature measurement module 212 can cause the memory bandwidth module 216 to gradually increase the memory bandwidth to the prior level as the rate of temperature change and/or the temperature decrease to and below the threshold rate and/or threshold temperature level. Based on receiving the resume control signal, the fan speed module 218 can increase the fan speed of the cooling fan 210 to a level prior to the cooling failure. Alternatively, the temperature measurement module 212 can cause the cooling fan module 218 to gradually increase the fan speed of the cooling fan 210 to the prior level as the rate of temperature change and/or the temperature decrease to and below the threshold rate and/or threshold temperature level. It should also be understood that the temperature measurement module 212, the performance state module 214, the memory bandwidth module 216, and the fan speed module 218 can be implemented in hardware, software, and/or any combination of hardware and software.

Figure 3:
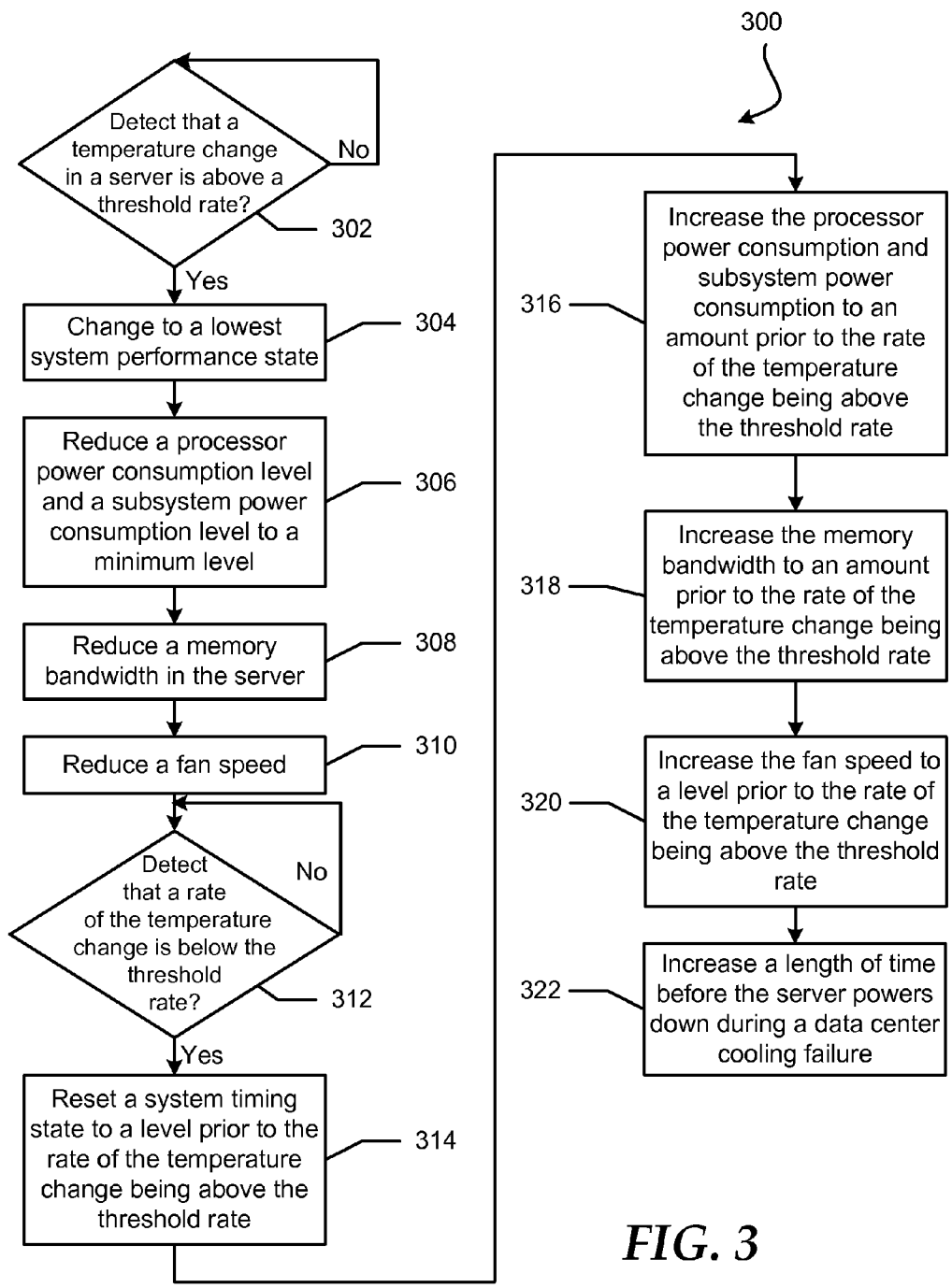
FIG. 3 is a flow diagram of a method for reducing power consumption in the server during a cooling failure in the data center.

FIG. 3 shows a flow diagram of a method 300 for reducing power consumption in a server during a cooling failure in the data center. At block 302, a determination is made whether a rate of temperature change in a server is above a threshold rate. If it is detected that the rate of temperature change in the server is above the threshold rate, a system performance state in the server is changed to a lowest performance state at block 304. At block 306, a processor power consumption and a subsystem power consumption is reduced to a minimum power level based on changing to the lowest system performance state. The power consumption can be reduced by throttling the processor in response to the lowest system performance state. A memory bandwidth is reduced to a minimum bandwidth level in response to the rate of temperature change being above the threshold rate at block 308. At block 310, a fan speed is reduced to a minimum fan speed level in response to the rate of temperature change being above the threshold rate.

At block 312, a determination is made whether the rate of the temperature change is below the threshold rate. If it is detected that the rate of the temperature change is below the threshold rate, the system performance state is reset to a level prior to the rate of the temperature change being above the threshold rate at block 314. At block 316, the processor power consumption and the subsystem power consumption are increased to an amount prior to the rate of the temperature change being above the threshold rate based on the rate of the temperature change being below the threshold rate.

At block 318, the memory bandwidth is increased to an amount prior to the rate of the temperature change being above the threshold rate based on the rate of the temperature change being below the threshold rate. The fan speed is increased to a level prior to the rate of the temperature change being above the threshold rate based on the rate of the temperature change being below the threshold rate at block 320. At block 322, a length of time before the server powers down during a data center cooling failure is increased based on changing to the lower system performance state, reducing the memory bandwidth, and reducing the fan speed in the server.

Figure 4:
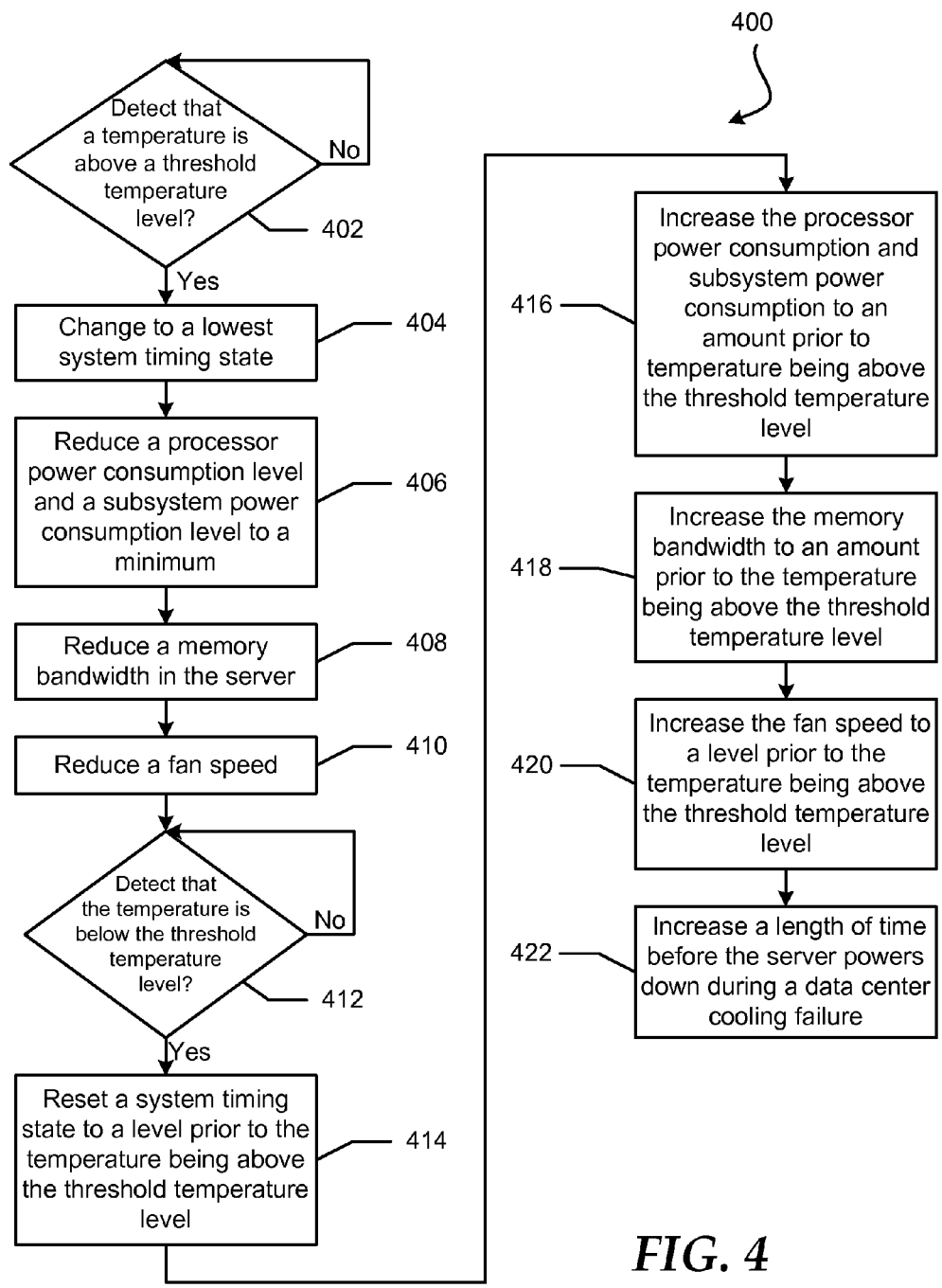
FIG. 4 is a flow diagram of an alternative method for reducing power consumption in the server during the cooling failure in the data center.

FIG. 4 shows a flow diagram of an alternative method 400 for reducing power consumption in a server during a cooling failure in the data center. At block 402, a determination is made whether a temperature in a server is above a threshold temperature level. If it is detected that the temperature in the server is above the threshold temperature level, a system performance state in the server is changed to a lowest performance state at block 404. At block 406, a processor power consumption and a subsystem power consumption is reduced to a minimum power level based on changing to the lowest system performance state. A memory bandwidth is reduced to a minimum bandwidth level in response to the temperature being above the threshold temperature level at block 408. At block 410, a fan speed is reduced to a minimum fan speed level in response to the temperature being above the threshold temperature level.

At block 412, a determination is made whether the temperature is below the threshold temperature level. If it is detected that the temperature is below the threshold temperature level, the system performance state is reset to a level prior to the temperature being above the threshold temperature level at block 414. At block 416, the processor power consumption and the subsystem power consumption are increased to an amount prior to the temperature being above the threshold temperature level based the temperature being below the threshold temperature level.

At block 418, the memory bandwidth is increased to an amount prior to the temperature being above the threshold temperature level based the temperature being below the threshold temperature level. The fan speed is increase to a level prior to the temperature being above the threshold temperature level based the temperature being below the threshold temperature level at block 420. At block 422, a length of time before the server powers down during a data center cooling failure is increased based on changing to the lower system performance state, reducing the memory bandwidth, and reducing the fan speed in the server.

Figure 5:
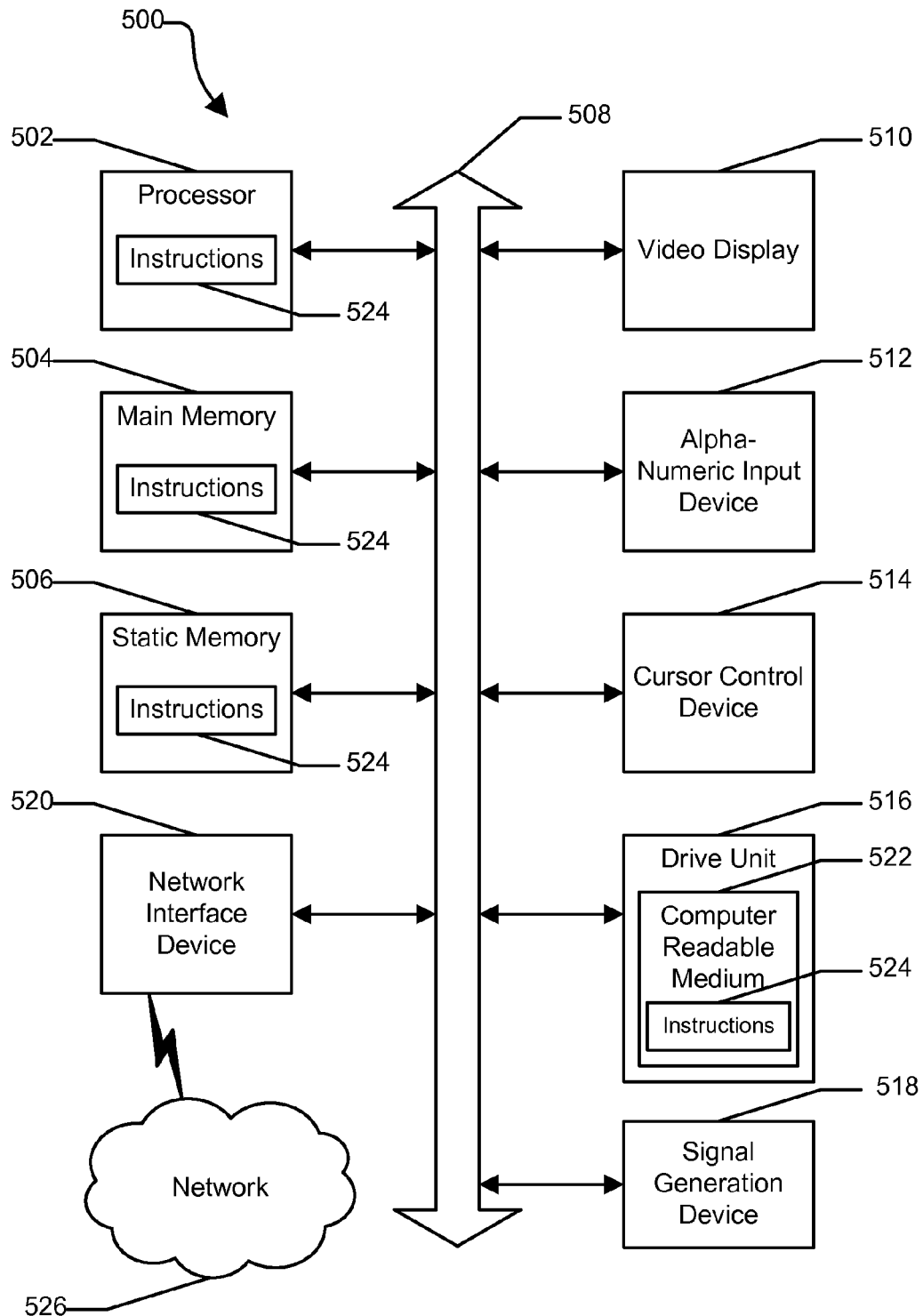
FIG. 5 is a block diagram of a general computer system.

FIG. 5 shows an illustrative embodiment of a general computer system 500 in accordance with at least one embodiment of the present disclosure. The computer system 500 can include a set of instructions that can be executed to cause the computer system to perform any one or more of the methods or computer based functions disclosed herein. The computer system 500 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 500 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 500 can be implemented using electronic devices that provide voice, video or data communication. Further, while a single computer system 500 is illustrated, the term "system" shall also be taken to include any collection of systems or sub-systems that individually or jointly execute a set, or multiple sets, of instructions to perform one or more computer functions.

The computer system 500 may include a processor 502, e.g., a central processing unit (CPU), a graphics processing unit (GPU), or both. Moreover, the computer system 500 can include a main memory 504 and a static memory 506 that can communicate with each other via a bus 508. As shown, the computer system 500 may further include a video display unit 510, such as a liquid crystal display (LCD), an organic light emitting diode (OLED), a flat panel display, a solid state display, or a cathode ray tube (CRT). Additionally, the computer system 500 may include an input device 512, such as a keyboard, and a cursor control device 514, such as a mouse. The computer system 500 can also include a disk drive unit 516, a signal generation device 518, such as a speaker or remote control, and a network interface device 520.

In a particular embodiment, as depicted in FIG. 5, the disk drive unit 516 may include a computer-readable medium 522 in which one or more sets of instructions 524, e.g. software, can be embedded. Further, the instructions 524 may embody one or more of the methods or logic as described herein. In a particular embodiment, the instructions 524 may reside completely, or at least partially, within the main memory 504, the static memory 506, and/or within the processor 502 during execution by the computer system 500. The main memory 504 and the processor 502 also may include computer-readable media. The network interface device 520 can provide connectivity to a network 526, e.g., a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 524 or receives and executes instructions 524 responsive to a propagated signal, so that a device connected to a network 526 can communicate voice, video or data over the network 526. Further, the instructions 524 may be transmitted or received over the network 526 via the network interface device 520.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A device comprising:
   a temperature measurement module configured to determine a temperature in a server, to output a first control signal when the temperature in the server is above a threshold temperature, to output a second control signal when the temperature in the server in below the threshold temperature, and to output a third control signal when the temperature in the server is continuing to increase above the threshold temperature;
   a performance state module in communication with the temperature measurement module, the performance state module configured to change a performance state of the device to a lowest system performance state in response to the first control signal, and further configured to reduce a processor power consumption and a subsystem power consumption to a minimum power level in response to reducing the performance state to the lowest system performance state; and
   a fan speed module in communication with the temperature measurement module, the fan speed module configured to reduce a fan speed level based on the first control signal, and to gradually reduce, in response to the third control signal, the fan speed proportionally to an amount that the temperature has increased above the threshold temperature until the fan speed is at the minimum fan speed level.

2. The device of claim 1 further comprising:
a memory bandwidth module in communication with the temperature measurement module, the memory bandwidth module configured to reduce a memory bandwidth to a minimum bandwidth level based on the first control signal.

3. The device of claim 2 wherein the memory bandwidth module is further configured to increase the memory bandwidth to an amount prior to the temperature being above the threshold temperature in response to the second control signal.

4. The device of claim 1 wherein the performance state module is further configured to reset the performance state of the device to a level prior to the temperature being above the threshold temperature in response to the second control signal, and to increase the processor power consumption and the subsystem power consumption to an amount prior to the temperature being above the threshold temperature in response to the second control signal.

5. The device of claim 1 wherein the fan speed module is further configured to increase the fan speed to a level prior to the temperature being above the threshold temperature in response to the second control signal.

6. A method comprising:
detecting that a temperature in a server is above a threshold temperature level;
changing the server to a lowest system performance state when the temperature in the server is above the threshold temperature level;
reducing a processor power consumption and a subsystem power consumption to a minimum power level when the server changes to the lowest system performance state;
reducing a memory bandwidth to a minimum bandwidth level when the temperature is above the threshold temperature level;
reducing a fan speed level when the temperature is above the threshold temperature level;
detecting that the temperature in the server is continuing to increase above the threshold temperature level; and
gradually reducing the fan speed proportionally to an amount that the temperature is above the threshold temperature level until the fan speed is at the minimum fan speed level.

7. The method of claim 6 further comprising:
detecting that the temperature is below the threshold temperature level;
resetting a system performance state to a level prior to the temperature being above the threshold temperature level when the temperature is below the threshold temperature level; and
increasing the processor power consumption and the subsystem power consumption to an amount prior to the temperature being above the threshold temperature level when the temperature is below the threshold temperature level.

8. The method of claim 6 further comprising:
detecting that the temperature is below the threshold temperature level; and
increasing the memory bandwidth to an amount prior to the temperature being above the threshold temperature level when the temperature is below the threshold temperature level.

9. The method of claim 6 further comprising:
detecting that the temperature is below the threshold temperature level; and
increasing the fan speed to an level prior to the temperature being above the threshold temperature level when the temperature is below the threshold temperature level.

10. The method of claim 6 wherein the temperature being above the threshold temperature level indicates a data center cooling failure.

11. The method of claim 6 wherein reducing the fan speed further comprises:
gradually reducing the fan speed proportionally to an amount that the temperature is above the threshold temperature level until the fan speed is at the minimum fan speed level.

12. The method of claim 6 further comprising:
increasing a length of time before the server powers down during a data center cooling failure when the server changes to the lower system performance state, reduces the memory bandwidth, and reduces the fan speed.

13. A method comprising:
detecting that a temperature in a server is above a threshold temperature;
changing the server to a lowest system performance state when the temperature in the server is above the threshold temperature;
reducing a processor power consumption and a subsystem power consumption to a minimum power level when the server changes to the lowest system performance state;
detecting that the temperature in the server is continuing to increase above the threshold temperature level; and
gradually reducing the fan speed proportionally to an amount that the temperature has increased above the threshold temperature until the fan speed is at the minimum fan speed level.

14. The method of claim 13 further comprising:
detecting that the temperature is below the threshold temperature;
resetting a system performance state to a level prior to the temperature being above the threshold temperature when the temperature is below the threshold temperature; and
increasing the processor power consumption and the subsystem power consumption to an amount prior to the temperature being above the threshold temperature when the temperature is below the threshold temperature.

15. The method of claim 13 further comprising:
reducing a memory bandwidth to a minimum bandwidth level when the temperature is above the threshold temperature.

16. The method of claim 15 further comprising:
detecting that the temperature is below the threshold temperature; and
increasing the memory bandwidth to an amount prior to the temperature being above the threshold temperature when the temperature is below the threshold temperature.

17. The method of claim 13 further comprising:
reducing a fan speed to a minimum fan speed level when the temperature is above the threshold temperature.

18. The method of claim 17 further comprising:
detecting that the temperature is below the threshold temperature; and
increasing the fan speed to an level prior to the temperature being above the threshold temperature when the temperature is below the threshold temperature.

19. The method of claim 13 further comprising:
increasing a length of time before the server powers down during a data center cooling failure when the server changes to the lower system performance state, reduces the memory bandwidth, and reduces the fan speed.

* * * * *